United States Patent
Lo et al.

(10) Patent No.: US 11,049,439 B2
(45) Date of Patent: Jun. 29, 2021

(54) DISPLAY DEVICE, TILING ELECTRONIC DEVICE AND METHOD FOR REPAIRING A DISPLAY DEVICE

(71) Applicant: InnoLux Corporation, Miao-Li County (TW)

(72) Inventors: Min-Hsin Lo, Miao-Li County (TW); Ker-Yih Kao, Miao-Li County (TW); Cheng-Hsu Chou, Miao-Li County (TW); Kung-Chen Kuo, Miao-Li County (TW); Hung-Sheng Liao, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 29 days.

(21) Appl. No.: 16/355,961

(22) Filed: Mar. 18, 2019

(65) Prior Publication Data
US 2019/0325813 A1  Oct. 24, 2019

Related U.S. Application Data

(60) Provisional application No. 62/659,797, filed on Apr. 19, 2018.

(30) Foreign Application Priority Data

Sep. 4, 2018  (CN) .......................... 201811027062.6

(51) Int. Cl.
*G09G 3/32* (2016.01)
*H01L 27/12* (2006.01)

(52) U.S. Cl.
CPC ............. *G09G 3/32* (2013.01); *H01L 27/124* (2013.01); *H01L 27/1222* (2013.01);
(Continued)

(58) Field of Classification Search
None
See application file for complete search history.

(56) References Cited

U.S. PATENT DOCUMENTS

| 9,590,023 B2 | 3/2017 | Kim et al. |
| 2010/0022153 A1 | 1/2010 | Yao et al. |

(Continued)

FOREIGN PATENT DOCUMENTS

| CN | 105225639 A | 1/2016 |
| EP | 1 887 551 A1 | 2/2008 |
| KR | 1020040079167 A | 9/2004 |

OTHER PUBLICATIONS

Partial European Search Report dated Jun. 15, 2020, issued in application No. EP 20170708.0.
(Continued)

*Primary Examiner* — Moazzam Hossain
*Assistant Examiner* — Stanetta D Isaac
(74) *Attorney, Agent, or Firm* — McClure, Qualey & Rodackk, LLP

(57) ABSTRACT

A display device includes a pixel array, multiple data lines and multiple gate lines. The pixel array includes multiple pixels. At least one of the pixels includes a first sub-pixel and a second sub-pixel. The first sub-pixel includes a pixel circuit, which includes a first light-emitting element and a first driving circuit. The first driving circuit is coupled to and configured to control the first light-emitting element. The first driving circuit includes multiple TFTs. The second sub-pixel includes a pixel circuit, which includes a second light-emitting element and a second driving circuit. The second driving circuit is coupled to and configured to control the second light-emitting element. The second driving circuit includes multiple TFTs. The number of TFTs of the first driving circuit and the number of TFTs of the second driving circuit are different.

15 Claims, 9 Drawing Sheets

(52) U.S. Cl.
CPC ..... *H01L 27/1259* (2013.01); *G09G 2330/08* (2013.01); *H01L 27/1248* (2013.01)

(56) References Cited

U.S. PATENT DOCUMENTS

2015/0108437 A1  4/2015  Cho et al.
2015/0243214 A1* 8/2015  Jeong .................... G09G 3/006
                                                           345/214

OTHER PUBLICATIONS

European Search Report dated May 24, 2019, issued in application No. EP 19167438.1.

* cited by examiner

DISPLAY DEVICE, TILING ELECTRONIC DEVICE AND METHOD FOR REPAIRING A DISPLAY DEVICE

CROSS REFERENCE TO RELATED APPLICATIONS

This application claims the benefit of U.S. Provisional Application No. 62/659,797 filed 2018 Apr. 19 and entitled "Circuit design location for active matrix (AM) LED Backlight unit (BLU) or Public information Display (PID)", and also claims priority of China Patent Application No. 201811027062.6, filed on Sep. 4, 2018, the entire contents of which are hereby incorporated by reference.

BACKGROUND

Field of the Disclosure

The disclosure relates to a display device and a tiling electronic device, and more particularly to a display device or a tiling electronic device configured with spare components for repairing a damaged pixel circuit when required.

Description of the Related Art

Recently, many different types of displays have been developed, including Organic light-emitting diode (OLED) displays, Liquid-Crystal Displays (LCD), light-emitting diode (LED) displays, Quantum Dot Displays, Electronic Paper Displays (EPD), etc. . . . .

Generally, display devices use multiple pixels to display images. A display panel with a pixel circuit that uses one or more Thin-Film Transistors (TFTs) as switching elements is called an active matrix display device. The switching elements are driven by the gate lines and data lines of the display device, so as to operate the pixels in the display device.

In order to provide sufficient current to drive the light-emitting elements, the active layer of the TFT must be designed to have a sufficiently high width-to-length ratio (W/L ratio). However, in a display device, even a small particle may cause a point defect, such as a pixel defect or a line defect. This is more serious when the width-to-length ratio of the TFT is high.

Such defects have become serious problems with the increase in the display area of display devices. To solve these problems, novel pixel circuit structures configured with spare components for repair and a corresponding method for repairing the damaged pixel circuit when required are provided.

BRIEF SUMMARY OF THE DISCLOSURE

A display device, a tiling electronic device and a method for repairing a display device are provided. An exemplary embodiment of a display device comprises a pixel array, a plurality of data lines and a plurality of gate lines. The pixel array comprises a plurality of pixels. The plurality of data lines is coupled to the pixel array. The plurality of gate lines is coupled to the pixel array. At least one of the pixels comprises a first sub-pixel and a second sub-pixel. The first sub-pixel comprises a pixel circuit. The pixel circuit of the first sub-pixel comprises a first light-emitting element and a first driving circuit. The first driving circuit is coupled to the first light-emitting element and is configured to control the first light-emitting element. The first driving circuit comprises a plurality of TFTs. The second sub-pixel comprises a pixel circuit. The pixel circuit of the second sub-pixel comprises a second light-emitting element and a second driving circuit. The second driving circuit is coupled to the second light-emitting element and is configured to control the second light-emitting element. The second driving circuit comprises a plurality of TFTs. The number of TFTs of the first driving circuit and the number of TFTs of the second driving circuit are different.

An exemplary embodiment of a tiling electronic device comprises a plurality of display devices as illustrated above and is configured to display an image signal. Any side of one of the display devices is disposed adjacent to any side of another of the display devices, and each of the display devices is configured to display a portion of the image signal.

An exemplary embodiment of a method for repairing a display device, wherein the display device comprises a first sub-pixel comprising a first light-emitting element and a first driving circuit, a second sub-pixel comprising a second light-emitting element and a second driving circuit and a third sub-pixel comprising a third light-emitting element and a third driving circuit, and wherein the first driving circuit, the second driving circuit and the third driving circuit respectively comprise a plurality of TFTs, comprises: configuring at least one spare pixel circuit in the display device, wherein the spare pixel circuit comprises a plurality of spare TFTs, and at least one electrode of one of the spare TFTs is electrically floating; when an abnormality occurs in one of the first sub-pixel, the second sub-pixel and the third sub-pixel, electrically insulating the TFTs in the abnormal sub-pixel from corresponding one of the first light-emitting element, the second light-emitting element and the third light-emitting element; and coupling a specific number of the spare TFTs to the corresponding one of the first light-emitting element, the second light-emitting element and the third light-emitting element so as to replace the TFTs in the abnormal sub-pixel.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION OF THE DISCLOSURE

In order to make the features of the disclosure more clear and easy to understand, the specific embodiments of the disclosure are given below and the accompanying drawings are described in detail as follows. The purpose of which is to explain the spirit of the present disclosure rather than to limit the protection scope of the present disclosure. It should be understood that the following embodiments may be implemented by software, hardware, firmware, or any combination of the above.

In the present disclosure, the technical features of the various embodiments may be substituted or combined with each other to achieve other embodiments when they are not mutually exclusive.

In the present disclosure, the term "couple", if not specifically defined, includes direct connection, indirect connection, electrical connection, and electrical coupling.

Figure 1:
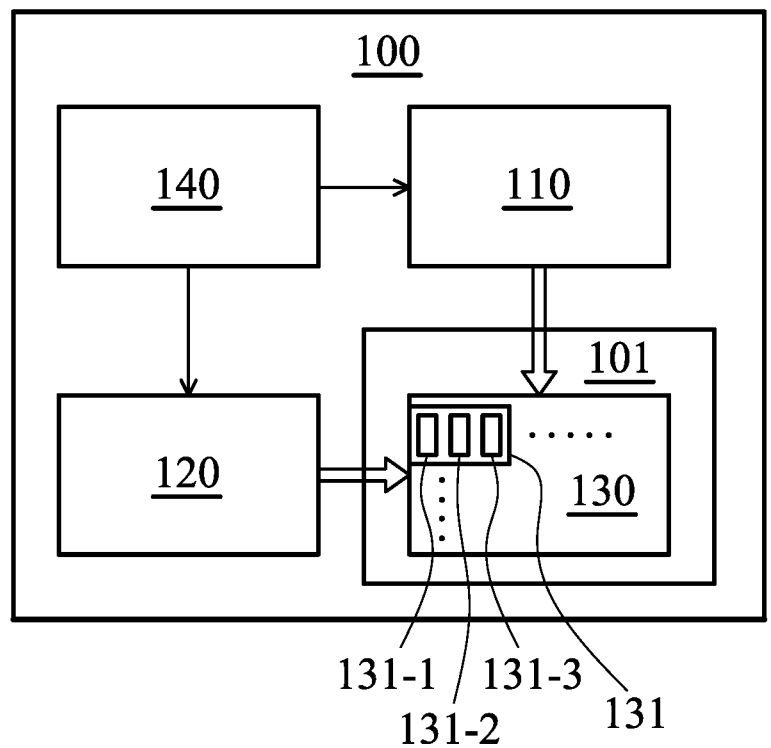
FIG. 1 shows an exemplary block diagram of a display device according to an embodiment of the disclosure.

FIG. 1 shows an exemplary block diagram of a display device according to an embodiment of the disclosure. As shown in FIG. 1, the display device 100 may comprise a substrate (not shown), a display panel 101, a gate driving circuit 110, a data driving circuit 120 and a control chip 140. The display panel 101 comprises a pixel array 130 configured on the substrate. The gate driving circuit 110 is coupled to the pixel array 130 via a plurality of gate lines, and is configured to provide a plurality of gate driving signals on the gate lines for driving a plurality of pixels 131 on the pixel array 130. The data driving circuit 120 is coupled to the pixel array 130 via a plurality of data lines, and is configured to provide a plurality of data driving signals on the data lines for writing image data to the plurality of pixels 131 on the pixel array 130 via the data driving signals. The control chip 140 is configured to receive an external signal and generate a plurality of timing signals, comprising clock signals, reset signals, start pulses, ending signals, or others. It should be noted that the display panel 101 may be an LCD panel, an OLED panel, a Mini-LED panel, a Micro-LED panel, a Quantum Dot display panel or an EPD panel. And in the disclosure, the display panel 101 may be a flexible, stretchable or rigid display panel.

According to the embodiments of the disclosure, the display device 100 may be applied in an electronic device. The electronic device may be implemented as various devices, comprising: a mobile phone, a digital camera, a lap-top computer, a personal computer, a television, an in-vehicle display, a portable DVD player, or any apparatus with image display functionality.

According to an embodiment of the disclosure, in FIG. 1, the gate driving circuit 110 is disposed outside of the pixel array 130. However, it should be noted that the disclosure is not limited thereto. In other embodiments of the disclosure, the gate driving circuit 110 may also be disposed inside of the pixel array 130. Similarly, although in FIG. 1, the gate driving circuit 110 is not configured on the display panel 101, the disclosure is not limited thereto. In other embodiments of the disclosure, the gate driving circuit 110 may also be disposed on the display panel 101. It should be understood that, in the disclosure, the area occupied by the pixel array 130 is the active area (AA) of the display panel 101 which is configured to display images, and the area not occupied by the pixel array 130 is the non-active area (NA) of the display panel 101 for disposing peripheral circuits. In addition, for the gate driving circuit 110 being disposed on the display panel 101 means that the gate driving circuit 110 is formed on the substrate of the display panel 101 by a photolithography process, thereby omitting the circuit board and the driving chip, and further reducing the production cost.

The pixel array 130 may comprise a plurality of pixels 131 and each pixel may further comprise a plurality of pixel units. In a color display, the pixel unit may correspond to a sub-pixel, such as a red (represented by R) sub-pixel 131-1, a blue (represented by B) sub-pixel 131-2 or a green (represented by G) sub-pixel 131-3, where a set of RGB sub-pixels corresponds to the pixel in the embodiments of the disclosure.

According to an embodiment of the disclosure, the pixel array 130 may comprise a plurality of original pixel circuits and a plurality of spare pixel circuits. Each sub-pixel may be configured with a corresponding original pixel circuit, and the number of spare pixel circuits may be equal to or less than a total number of sub-pixels. When the number of spare pixel circuits is less than the total number of sub-pixels, the spare pixel circuits are shared by the sub-pixels in the pixel array 130. According to an embodiment of the disclosure, the spare pixel circuits are configured in the display device 100 such that when an abnormality occurs in any original pixel circuit, the components of the spare pixel circuit can be utilized to replace the corresponding components in the abnormal original pixel circuit. In this manner, the display device can be repaired, the lifespan of the display device can be extended or the problem of poor user experience due to the pixel defect or the line defect caused by the damaged pixel circuit can be avoided. Especially, when manufacturing a tiling electronic device (for example, a large display device), if a portion of the original pixel circuits has been detected as being abnormal or damaged via some test during the production process or when the production is completed, directly discarding the entire display device will result in serious production cost loss. Therefore, the production cost of the display device can also be effectively reduced by configuring and applying the spare pixel circuits.

According to an embodiment of the disclosure, at least one of the pixels in the pixel array 130 may comprise at least a first sub-pixel 131-1 (or called pixel unit) and a second sub-pixel 132-2. The pixel circuit of the first sub-pixel 131-1 may comprise a first light-emitting element and a first driving circuit. The pixel circuit of the second sub-pixel 131-2 may comprise a second light-emitting element and a second driving circuit. The driving circuit of each sub-pixel is coupled to the corresponding light-emitting element and configured to control the corresponding light-emitting element.

Figure 2:
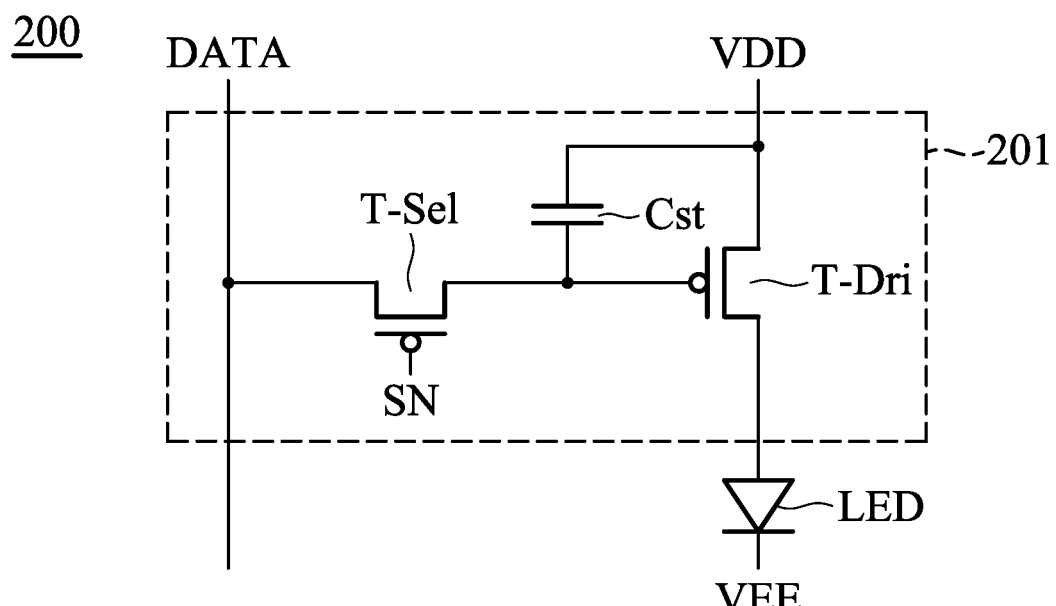
FIG. 2 is an exemplary circuit diagram of a pixel circuit according to an embodiment of the disclosure.

FIG. 2 is an exemplary circuit diagram of a pixel circuit according to an embodiment of the disclosure. The pixel circuit 200 may comprise a light-emitting diode LED and a driving circuit 201 coupled to the light-emitting diode LED for driving the light-emitting diode LED. The driving circuit 201 may comprise a selection transistor T-Sel, a driving transistor T-Dri and a capacitor Cst. The selection transistor T-Sel is coupled to the gate line and the data line and is turned on in response to the gate driving signal SN. Via the turned on selection transistor T-Sel, the data driving signal DATA provided on the data line may be provided to the driving transistor T-Dri. The driving transistor T-Dri may be coupled between the terminal for supplying the system voltage VDD and the light-emitting diode LED, and is turned on in response to the data driving signal DATA for providing driving current to the light-emitting diode LED. The cathode of the light-emitting diode LED is coupled to the terminal for supplying the voltage VEE and the amount of driving current of the light-emitting diode LED is controlled by the data driving signal DATA. In an embodiment, the selection transistor T-Sel or the driving transistor T-Dri may be an amorphous thin-film transistor, a low temperature polysilicon thin-film transistor, a metal-oxide thin-film transistor, or a transistor with a mixed structure as discussed above. However, the disclosure is not limited thereto.

It should be noted that FIG. 2 is merely a schematic diagram of a pixel circuit for illustrating one of a variety of pixel circuits, in which the spare pixel circuit and the repairing method of the disclosure can be applied. Therefore, the disclosure is not limited to what is shown in FIG. 2. In addition, it should be noted that, although there is only one driving transistor T-Dri shown in FIG. 2 for simplicity, the disclosure should not be limited thereto. When implementing the pixel circuit, the driving transistor T-Dri may be multiple transistors electrically connected in parallel, series, or any combination thereto, and the number of transistors and the coupling relationship thereof may be flexibly designed based on different requirements, so as to achieve the required driving capability. Therefore, the disclosure is not limited to what is shown in FIG. 2.

According to an embodiment of the disclosure, the first driving circuit of the first sub-pixel 131-1 may comprise a plurality of Thin-Film Transistors (TFTs) as the aforementioned driving transistor, the second driving circuit of the second sub-pixel 131-2 may comprise a plurality of TFTs as the aforementioned driving transistor, and there may be a different number of TFTs in the first driving circuit than there are in the second driving circuit. For example, when the first light-emitting element and the second light-emitting element configured for displaying different colors, the required driving current thereof may be different. Therefore, there may be a different number of TFTs in the first driving circuit than there are in the second driving circuit. It should be noted that when the first light-emitting element and the second light-emitting element display the same color (i.e. white), or, when the driving current required by the first driving circuit is the same as or is similar to the driving current required by the second driving circuit, there may be the same number of TFTs in the first driving circuit as there are in the second driving circuit.

According to an embodiment of the disclosure, when the first driving circuit comprises a plurality of P-type TFTs, the TFTs may be coupled in parallel between the terminal for supplying the system voltage VDD and the anode of the corresponding light-emitting diode LED. Similarly, when the second driving circuit comprises a plurality of P-type TFTs, the TFTs may be coupled in parallel between the terminal for supplying the system voltage VDD and the anode of the corresponding light-emitting diode LED.

According to an embodiment of the disclosure, the aforementioned at least one of the pixels in the pixel array 130 may further comprise a third sub-pixel 131-3. The pixel circuit of the third sub-pixel 131-3 may comprise a third light-emitting element and a third driving circuit. The third driving circuit is coupled to the third light-emitting element and configured to control the third light-emitting element. The third driving circuit may comprise a plurality of P-type TFTs as the aforementioned driving transistor. When the third driving circuit comprises a plurality of P-type TFTs, the TFTs may be coupled in parallel between the terminal for supplying the system voltage VDD and the anode of the corresponding light-emitting diode LED. In another embodiment, when the first driving circuit, the second driving circuit or the third driving circuit comprise a plurality of N-type TFTs, the TFTs may be coupled in parallel between the terminal for supplying the system voltage VEE and the cathode of the corresponding light-emitting diode LED. It should be noted that the arrangements illustrated above are merely examples and are not intended to limit the disclosure.

According to an embodiment of the disclosure, the number (a first number) of the TFTs configured in the first driving circuit may be greater than the number (a second number) of the TFTs configured in the second driving circuit, and the number of TFTs configured in the second driving circuit may be greater than the number (a third number) of the TFTs configured in the third driving circuit. For example, the first sub-pixel 131-1 may be a red sub-pixel, the second sub-pixel 131-2 may be a green sub-pixel, and the third sub-pixel 131-3 may be a blue sub-pixel. Suppose that the driving current required by the red sub-pixel (e.g. 131-1) is greater than the driving current required by the green sub-pixel (e.g. 131-2), and the driving current required by the green sub-pixel (e.g. 131-2) is greater than the driving current required by the blue sub-pixel (e.g. 131-3), the number of TFTs configured in the red sub-pixel (e.g. 131-1) may be greater than the number of TFTs configured in the green sub-pixel (e.g. 131-2), and the number of TFTs configured in the green sub-pixel (e.g. 131-2) may be greater than the number of TFTs configured in the blue sub-pixel (e.g. 131-3). It should be noted that the number of sub-pixels illustrated above is merely one example and is not intended to limit the disclosure. In other embodiments, a fourth sub-pixel (e.g. a yellow sub-pixel) or a fifth sub-pixel (e.g. a white sub-pixel) may also be of the at least one of the pixels.

It should be noted that the pixel circuit with the driving circuit coupled to the light-emitting element is the original pixel circuit configured for each sub-pixel. In the embodiments of the disclosure, the pixel array 130 may further comprise at least one spare pixel circuit. The spare pixel circuit may comprise a plurality of spare TFTs. At least one electrode of one of the spare TFTs is electrically floating. In the embodiments of the disclosure, when an abnormality occurs in any one of the above-illustrated sub-pixels, a specific number, which is determined based on the number of TFTs required by the abnormal sub-pixel (such as the first number, the second number or the third number as illustrated above) of the spare TFTs are coupled to corresponding light-emitting element in the abnormal sub-pixel, so as to replace the TFTs in the original pixel circuit of the abnormal sub-pixel and to be utilized as the driving transistor for driving the corresponding light-emitting element. In an embodiment, the specific number may be the first number, the second number or the third number as illustrated above. It should be noted that the numbers illustrated above are merely examples and are not intended to limit the disclosure.

According to a first embodiment of the disclosure, when a portion of the original pixel circuits has been detected as abnormal or damaged by a specific test circuit or an optical instrument (for example, observed through an optical microscope) disposed in the AA or NA of the display panel 101, a number (the specific number as discussed above) of spare TFTs are selected to replace the TFTs in the original pixel circuit of the abnormal or damaged sub-pixel and to be utilized as the driving transistor for driving the corresponding light-emitting element, where the number of spare TFTs to be selected is determined based on number of TFTs required by the abnormal or damaged sub-pixel, and may be the same as the number of TFTs required by the abnormal or damaged sub-pixel.

Figure 3:
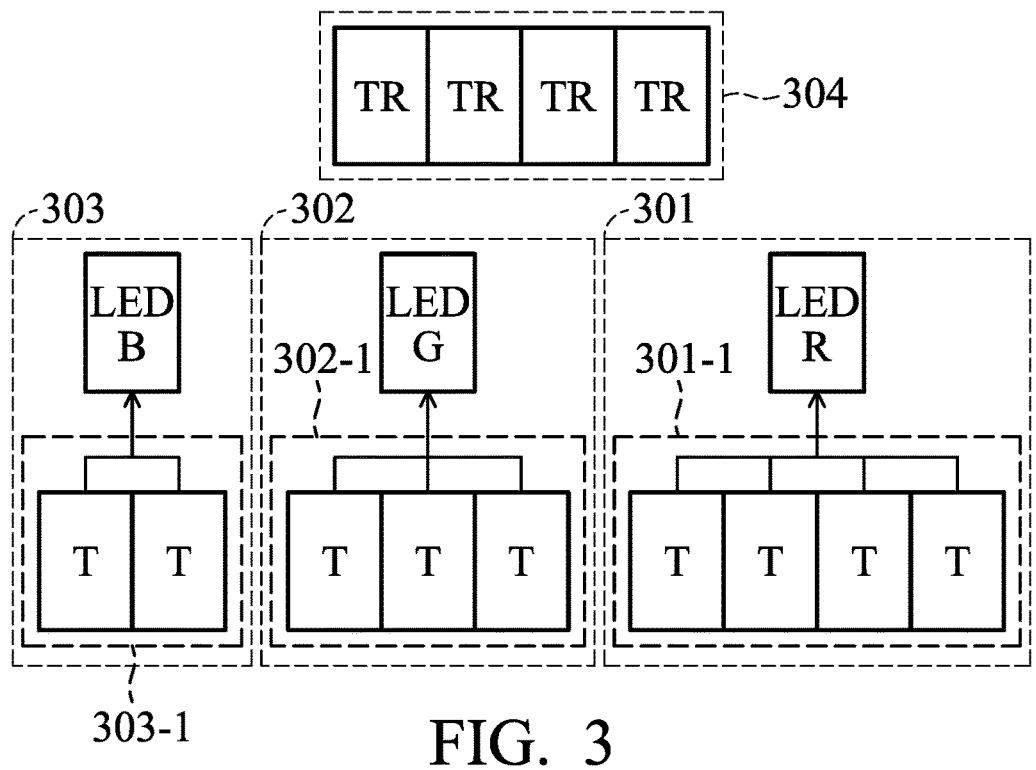
FIG. 3 is a schematic diagram showing the configurations of the original pixel circuit and the spare pixel circuit according to a first embodiment of the disclosure.

FIG. 3 is a schematic diagram showing the configurations of the original pixel circuit 301/302/303 and the spare pixel circuit 304 according to a first embodiment of the disclosure. The schematic diagram shown in FIG. 3 is applied in a default status (that is, when the repair has not been performed) of the display panel. It should be noted that in order to clearly illustrate the embodiment, only the TFTs are shown in each pixel circuit. However, those who are skilled in this technology can readily appreciate that the pixel circuit may further comprise other circuit components not shown in FIG. 3.

For discrimination, the TFTs labeled by TR represent the spare TFTs in the spare pixel circuit 304, the TFTs labeled by T represent the original TFTs in the original pixel circuit 301/302/303, the LED B represents the light-emitting diode in the blue sub-pixel (e.g. 131-3), the LED G represents the light-emitting diode in the green sub-pixel (e.g. 131-2) and the LED R represents the light-emitting diode in the red sub-pixel (e.g. 131-1).

In the embodiments of the disclosure, the spare TFTs TR are disposed in the area adjacent to the original TFTs T, for easy repair. In addition, the conductive pad of each electrode of the spare TFTs TR may also be disposed in the unmasked region so that, when repair is required, the electrode of the spare TFTs TR can be changed from an electrically floating state to another state, in which the electrical connection(s) is/are generated between the spare TFTs TR and the corresponding terminals. The method of generating the electrical connection can be, for example, using welding technology.

Figure 3A:
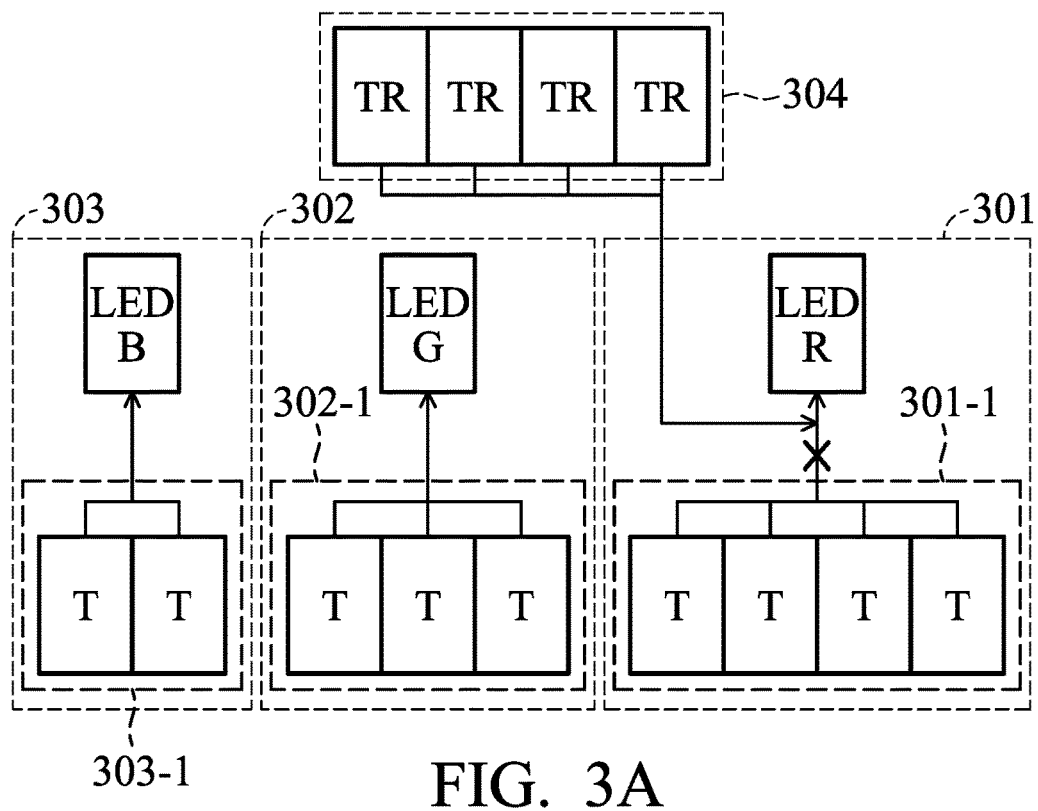
FIG. 3A is a schematic diagram of repairing the pixel circuit in the red sub-pixel by using the spare pixel circuit according to the first embodiment of the disclosure.

FIG. 3A is a schematic diagram of repairing the pixel circuit in the red sub-pixel (e.g. 131-1) by using the spare pixel circuit 304 according to the first embodiment of the disclosure. In the embodiment of the disclosure, when an abnormality occurs in the pixel circuit 301 of the red sub-pixel (e.g. 131-1), the original TFTs T and the light-emitting element LED R of the abnormal red sub-pixel (e.g. 131-1) are first electrically insulated, so as to disconnect the electrical connection therebetween. Next, one terminal of the first number (e.g. in this embodiment, 4) of spare TFTs TR are coupled to the light-emitting element LED R of the abnormal red sub-pixel (e.g. 131-1), and another terminal of the spare TFTs TR are coupled to the terminal for supplying the system voltage VDD/VEE, so as to replace the original TFTs T and to be utilized as the driving transistor of the light-emitting element LED R.

Another embodiment of the disclosure is to repair the pixel circuit in the green sub-pixel (e.g. 131-2) by using the spare pixel circuit (not shown in the figure, note that the only difference when comparing to the embodiment of repairing the pixel circuit in the red sub-pixel (e.g. 131-1) is the number of TFTs). In this embodiment, when an abnormality occurs in the pixel circuit of the green sub-pixel, the original TFTs T and the light-emitting element LED G of the abnormal green sub-pixel (e.g. 131-2) are first electrically insulated, so as to disconnect the electrical connection therebetween. Next, one terminal of the second number (e.g. in this embodiment, 3) of spare TFTs TR are coupled to the light-emitting element LED G of the abnormal green sub-pixel, and another terminal of the spare TFTs TR are coupled to the terminal for supplying the system voltage VDD/VEE, so as to replace the original TFTs T and to be utilized as the driving transistor of the light-emitting element LED G.

Another embodiment of the disclosure is to repair the pixel circuit in the blue sub-pixel (e.g. 131-3) by using the spare pixel circuit (not shown in the figure, note that the only difference when comparing to the embodiment of repairing the pixel circuit in the red sub-pixel 131-1 is the number of TFTs). In this embodiment, when an abnormality occurs in the pixel circuit of the blue sub-pixel, the original TFTs T and the light-emitting element LED B of the abnormal blue sub-pixel (e.g. 131-3) are first electrically insulated, so as to disconnect the electrical connection therebetween. Next, one terminal of the third number (e.g. in this embodiment, 2) of spare TFTs TR are coupled to the light-emitting element LED B of the abnormal blue sub-pixel, and another terminal of the spare TFTs TR are coupled to the terminal for supplying the system voltage VDD/VEE, so as to replace the original TFTs T and to be utilized as the driving transistor of the light-emitting element LED B.

It should be noted that the configuration of spare pixel circuit 304 in the embodiments of the disclosure is not limited to repair the display panel, and is also applicable for repairing the backlight panel.

Figure 4:
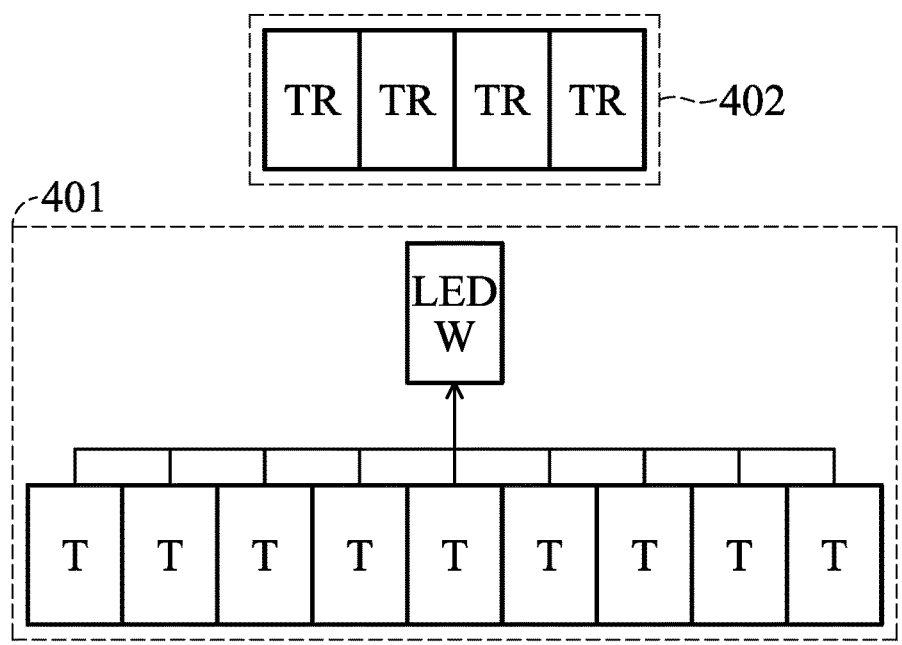
FIG. 4 is another schematic diagram showing the configurations of the original pixel circuit and the spare pixel circuit according to the first embodiment of the disclosure.

FIG. 4 is another schematic diagram showing the configurations of the original driving circuit 401 and the spare circuit 402 according to the first embodiment of the disclosure. The schematic diagram shown in FIG. 4 is applied in a default status (that is, when the repair has not been performed) of the backlight panel. It should be noted that in order to clearly illustrate the embodiment, only the TFTs are shown in the driving circuit 401 and the spare circuit 402. However, those who are skilled in this technology can readily appreciate that the pixel circuit may further comprise other circuit components not shown in FIG. 4.

Similarly, in this schematic diagram, the TFTs labeled by TR represent the spare TFTs in the spare circuit 402, the TFTs labeled by T represent the original TFTs in the original driving circuit 401, the LED W represents the light-emitting diode in the driving circuit 401. The spare TFTs TR are disposed in the area adjacent to the original TFTs T, for easy repair. In addition, the conductive pad of each electrode of the spare TFTs TR may also be disposed in the unmasked region so that, when repair is required, the electrode of the spare TFTs TR can be changed from an electrically floating state to another state in which the electrical connection(s) is/are generated between the spare TFTs TR and the corresponding terminals. The method of generating the electrical connection can be, for example, using welding technology.

Figure 4A:
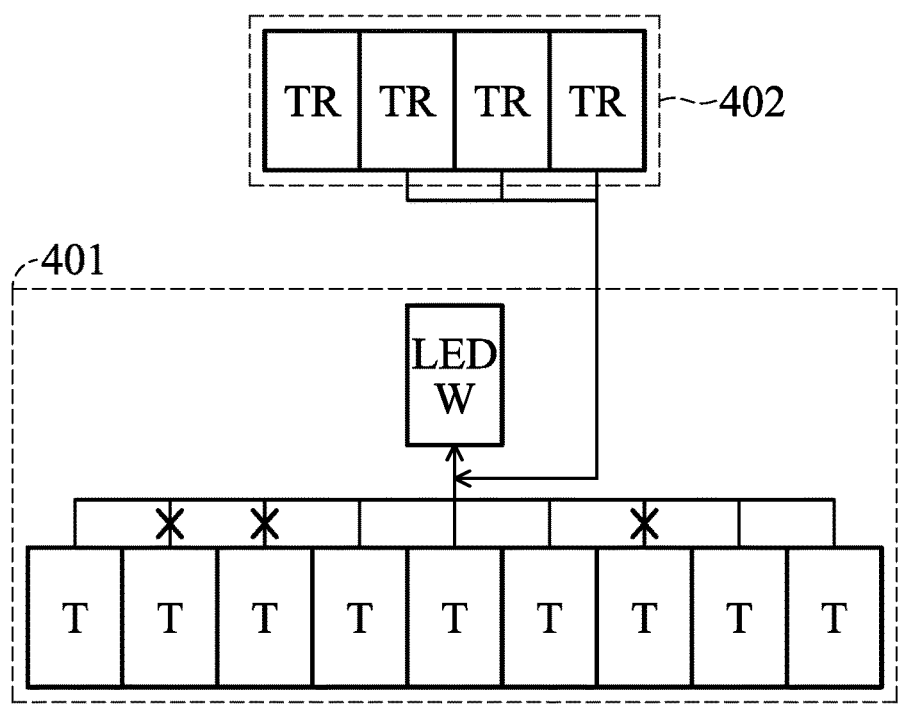
FIG. 4A is a schematic diagram of repairing the driving circuit 401 of the backlight unit by using the spare circuit 402 according to the first embodiment of the disclosure.

FIG. 4A is a schematic diagram of repairing the driving circuit 401 of the backlight unit by using the spare circuit 402 according to the first embodiment of the disclosure. In the embodiment of the disclosure, when an abnormality occurs in a specific number of original TFTs T of the driving circuit 401, the abnormal TFTs T and the light-emitting element LED W are electrically insulated, so as to disconnect the electrical connection therebetween. Next, one terminal of the specific number (e.g. in this embodiment, 3) of spare TFTs TR are coupled to the light-emitting element LED W, and another terminal of the spare TFTs TR are coupled to the terminal for supplying the system voltage, so as to replace the original TFTs T and to be utilized as the driving transistor of the light-emitting element LED W.

According to an embodiment of the disclosure, the number of spare TFTs of the spare pixel circuit may be selected as the maximum number of original TFTs configured in one original pixel circuit. For example, in cases where the first number mentioned above is greater than the second number and the second number is greater than the third number, the number of spare TFTs of the spare pixel circuit may be selected to be the first number. In another embodiment, the first number, the second number and the third number may be the same number or different numbers, or at least one may be different from the other two numbers. Without departing from the scope and spirit of this disclosure, the numbers may be flexible adjusted based on the actual requirements. In addition, according to an embodiment of the disclosure, at least a predetermined number of spare TFTs may be coupled in parallel in advance, and the predetermined number may be select as the minimum number of original TFTs configured in one original pixel circuit. For example, in cases where the first number mentioned above is greater than the second number and the second number is greater than the third number, the predetermined number may be selected to be the third number. It should be noted that in the embodiments of the disclosure, the specific number and the predetermined number may stand for different meanings. To be more specific, the specific number may refer to a number that is equal to the number of TFTs required by a damaged sub-pixel, and the predetermined number may refer to the number of spare TFTs that are coupled in parallel in advance.

In addition, according to an embodiment of the disclosure, the width-to-length ratio of the TFTs of the pixel array 130 may be between 20:1 and 25:1.

Figure 5:
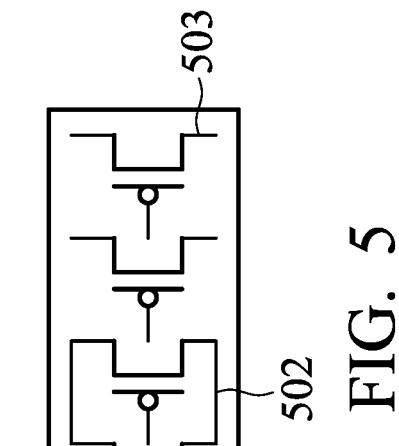
FIG. 5 shows an exemplary circuit diagram of a spare pixel circuit according to the first embodiment of the disclosure.

FIG. 5 shows an exemplary circuit diagram of a spare pixel circuit 500 according to the first embodiment of the disclosure. In this embodiment, it is supposed that the driving circuit of the red sub-pixel (e.g. 131-1) comprises four TFTs coupled in parallel as the driving transistor, the driving circuit of the green sub-pixel (e.g. 131-2) comprises three TFTs coupled in parallel as the driving transistor, and the driving circuit of the blue sub-pixel (e.g. 131-3) comprises two TFTs coupled in parallel as the driving transistor. In this manner, the spare pixel circuit 500 may be designed to comprise four TFTs and at least two TFTs 502 are coupled in parallel in advance, and at least one electrode of one of the spare TFTs 503 is electrically floating.

Figure 5A:
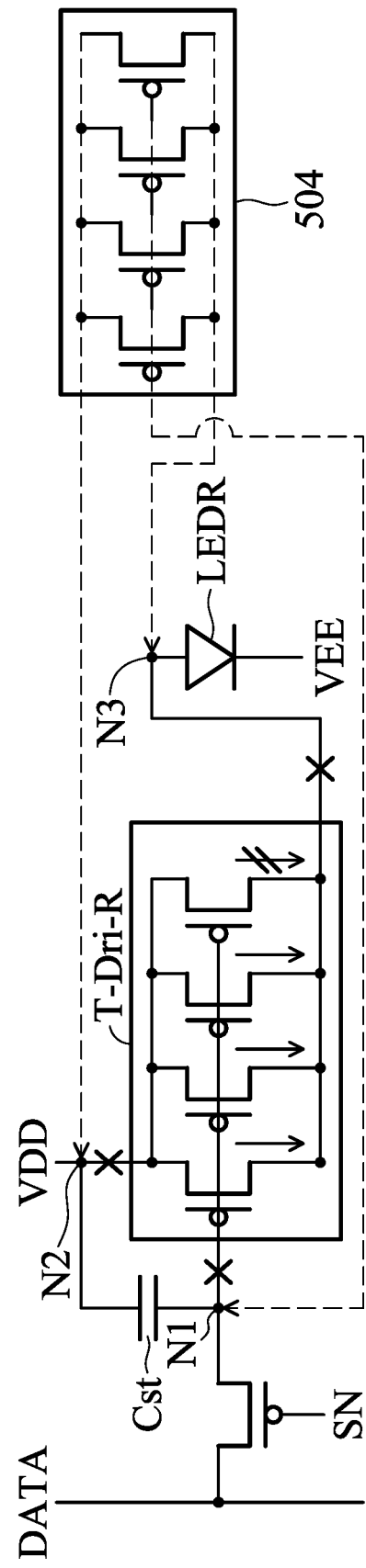
FIG. 5A is a schematic diagram of repairing the pixel circuit in the red sub-pixel by using the spare pixel circuit according to the first embodiment of the disclosure.

FIG. 5A is a schematic diagram of repairing the pixel circuit in the red sub-pixel (e.g. 131-1) by using the spare pixel circuit 504 according to the first embodiment of the disclosure. In this embodiment, the driving circuit of the red sub-pixel (e.g. 131-1) comprises four TFTs coupled in parallel as the driving transistor T-Dri-R. Suppose that one of the TFTs is damaged and cannot conduct current, the driving current of the light-emitting diode LED R may be reduced to ¾ of the amount originally required. Therefore, according to the first embodiment of the disclosure, the electrical connections between the original driving transistor T-Dri-R and the terminals N1, N2 and N3 are first disconnected (as the cross signs shown in figure) (or, at least disconnecting the electrical connections between the original driving transistors T-Dri-R and the terminals N2 and N3). Next, the gates of four spare TFTs are commonly coupled to (as the slashes shown in the figure) the terminal N1, the drains/sources of these spare TFTs are commonly coupled to the terminal N2 and the sources/drains of these spare TFTs are commonly coupled to the terminal N3 (or, at least coupling the drains and of the sources of four spare TFTs to the terminals N2 and N3), so as to replace the original TFTs and utilized as the driving transistor for driving the light-emitting element LED R.

Another embodiment of the disclosure is to repair the pixel circuit in the green sub-pixel (e.g. 131-2) by using the spare pixel circuit 500 (not shown in the figure, note that the only difference when comparing to the embodiment of repairing the pixel circuit in the red sub-pixel (e.g. 131-1) is the number of TFTs). In this embodiment, the driving circuit of the green sub-pixel (e.g. 131-2) comprises three TFTs coupled in parallel as the driving transistor T-Dri-G. Suppose that one of the TFTs is damaged and cannot conduct current, the driving current of the light-emitting diode LED G may be reduced to ⅔ of the amount originally required. Therefore, according to the first embodiment of the disclosure, the electrical connections between the original driving transistor T-Dri-G and the terminals N1, N2 and N3 are first disconnected (as the cross signs shown in figure) (or, at least disconnecting the electrical connections between the original driving transistor T-Dri-G and the terminals N2 and N3). Next, the gates of three spare TFTs are commonly coupled to (as the slashes shown in the figure) the terminal N1, the drains/sources of these spare TFTs are commonly coupled to the terminal N2 and the sources/drains of these spare TFTs are commonly coupled to the terminal N3 (or, at least coupling the drains and of the sources of three spare TFTs to the terminals N2 and N3), so as to replace the original TFTs and utilized as the driving transistor for driving the light-emitting element LED G.

Another embodiment of the disclosure is to repair the pixel circuit in the blue sub-pixel (e.g. 131-3) by using the spare pixel circuit 500 (not shown in the figure, note that the only difference when comparing to the embodiment of repairing the pixel circuit in the red sub-pixel (e.g. 131-1) is the number of TFTs). In this embodiment, the driving circuit of the blue sub-pixel (e.g. 131-3) comprises two TFTs coupled in parallel as the driving transistor T-Dri-B. Suppose that one of the TFTs is damaged and cannot conduct current, the driving current of the light-emitting diode LED B may be reduced to ½ of the amount originally required. Therefore, according to the first embodiment of the disclosure, the electrical connections between the original driving transistor T-Dri-B and the terminals N1, N2 and N3 are first disconnected (as the cross signs shown in figure) (or, at least disconnecting the electrical connections between the original driving transistor T-Dri-B and the terminals N2 and N3). Next, the gates of two spare TFTs are commonly coupled to (as the slashes shown in the figure) the terminal N1, the drains/sources of these spare TFTs are commonly coupled to the terminal N2 and the sources/drains of these spare TFTs are commonly coupled to the terminal N3 (or, at least coupling the drains and of the sources of two spare TFTs to the terminals N2 and N3), so as to replace the original TFTs and utilized as the driving transistor for driving the light-emitting element LED B.

Figure 6:
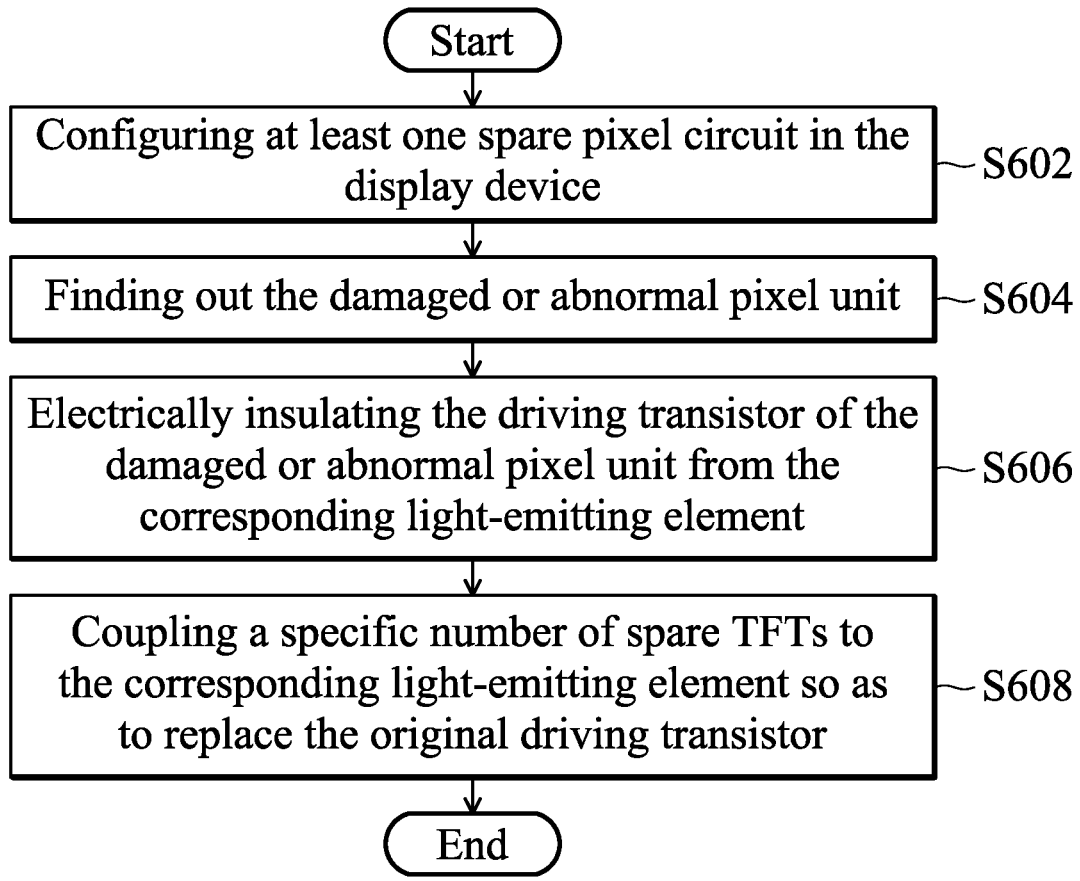
FIG. 6 is an exemplary flow chart of a method for repairing a display device according to the first embodiment of the disclosure.

FIG. 6 is an exemplary flow chart of a method for repairing a display device according to the first embodiment of the disclosure. First of all, at least one spare pixel circuit is configured in the display device (Step S602). The spare pixel circuit comprises a plurality of spare TFTs, and at least one electrode of one of the spare TFTs is electrically floating by default. Next, the manufacturer of the display device may find the damaged or abnormal pixel unit (or sub-pixel) by testing whether each driving circuit functions normally and provides sufficient driving current required by the corresponding light-emitting element via the specific test circuit disposed in the AA or NA of the display panel 101 before installing the corresponding light-emitting element (Step S604). If the light-emitting elements have already been installed, the manufacturer of the display device may also find the damaged or abnormal pixel unit (or sub-pixel) by using an optical instrument (for example, an optical microscope) when any bright spot or dark spot has been detected (Step S604). Next, when a damaged or abnormal pixel unit (or sub-pixel) has been found, the driving transistor of the damaged or abnormal pixel unit (or sub-pixel) is electrically insulated from the corresponding light-emitting element (Step S606). That is, the electrical connection therebetween is disconnected. Finally, a specific number of spare TFTs are coupled to the corresponding light-emitting element so as to replace the original driving transistor (Step S608).

According to an embodiment of the disclosure, in step S606, the driving transistor of the damaged or abnormal pixel unit may be electrically insulated from the corresponding light-emitting element by disconnecting the electrical connection therebetween. For example, laser cutting may be used to disconnect the electrical connection.

According to an embodiment of the disclosure, in step S608, the specific number of spare TFTs may be coupled to the corresponding light-emitting element by welding. For example, electrical connections may be generated by laser welding.

Figure 7A:
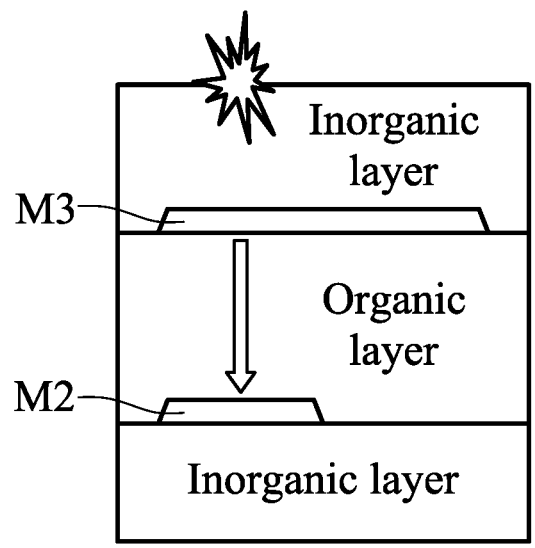
FIG. 7A is a schematic diagram of laser welding two metal layers according to an embodiment of the disclosure.

FIG. 7A is a schematic diagram of laser welding two metal layers according to an embodiment of the disclosure. In this embodiment, an electrode of the spare TFT may be disposed in the metal layer M2, the anode or cathode of the light-emitting element may be disposed in the metal layer M3, where the metal layers M2 and M3 may overlap in the vertical direction (that is, the vertical projections of the metal layers M2 and M3 may at least partially overlap each other). In a default status (that is, when the repair has not been performed), the metal layer M2 and the metal layer M3 are electrically insulated. When performing the repair, the organic layer between the metal layer M2 and the metal layer M3 may be penetrated by laser welding, so that one electrode of the spare TFT can be coupled to the anode of the corresponding light-emitting element.

Figure 7B:
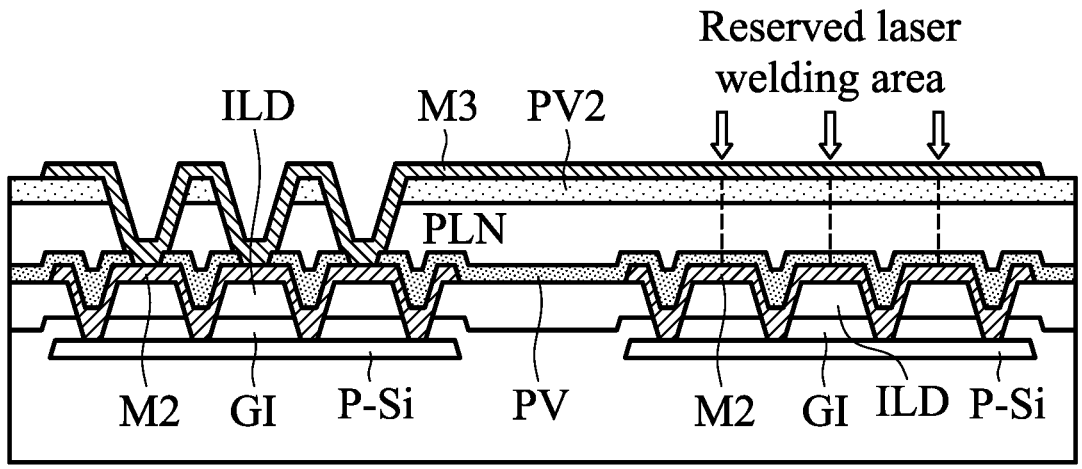
FIG. 7B is a schematic diagram showing the reserved laser welding area according to the first embodiment of the disclosure.

FIG. 7B is a schematic diagram showing the reserved laser welding area according to the first embodiment of the disclosure. The left portion of FIG. 7B shows a cross-sectional view of the source/drain of the TFT in the original pixel circuit and the right portion of FIG. 7B is a cross-sectional view of the source/drain of the TFT in the spare pixel circuit. In this embodiment, the source/drain of the TFT may be disposed in the metal layer M2 and the anode of the light-emitting element may be disposed in the metal layer M3. The layers below the metal layer M3 is sequentially a passivation layer PV2, a planarization layer PLN, a protection layer PV, a metal layer M2, an inter layer deposition ILD, a gate insulator layer GI, and a polysilicon P—Si layer. As shown in FIG. 7B, the source/drain (the metal layer M2) of the TFT in the original pixel circuit is coupled to the metal layer M3, and the source/drain of the TFT in the spare pixel circuit is not coupled to the metal layer M3. When performing the repair, the metal layer M2 and the metal layer M3 on the left side may be electrically insulated from each other by laser cutting, so as to disconnect their electrical connection, and the metal layer M2 and the metal layer M3 on the right side reserved laser welding area may be penetrated by laser welding, such that the source/drain of the spare TFT can be coupled to the corresponding anode of the corresponding light-emitting element.

Figure 7C:
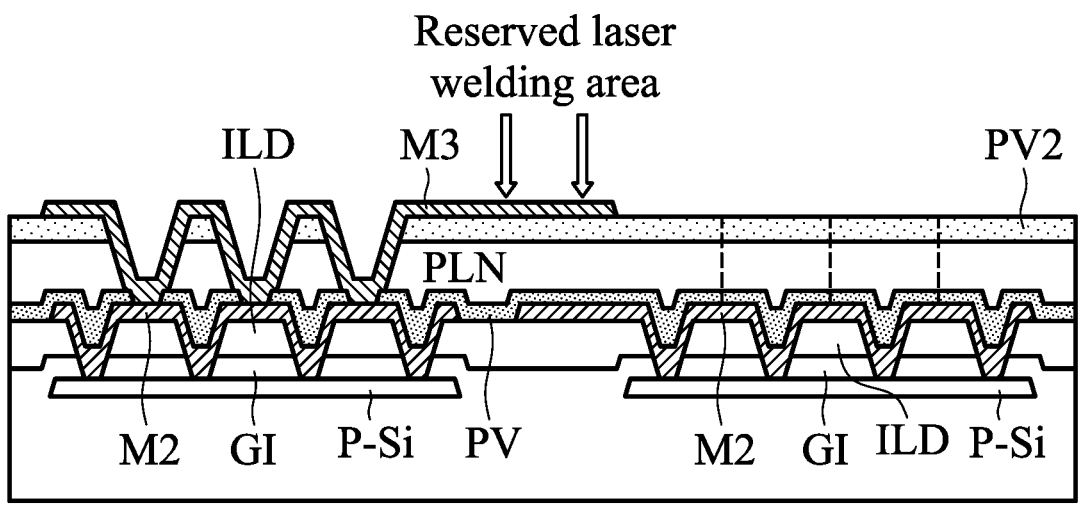
FIG. 7C is another schematic diagram showing the reserved laser welding area according to the first embodiment of the disclosure.

FIG. 7C is another schematic diagram showing the reserved laser welding area according to the first embodiment of the disclosure. In this embodiment, the position of the reserved laser welding area has been changed, which helps to prevent the laser welding operation from damaging the active layer (P—Si) of the spare TFT.

According to another embodiment of the disclosure, in step S608, the specific number of spare TFTs may be coupled to the corresponding light-emitting element by welding, such as tungsten inert gas (TIG) welding.

Figure 7D:
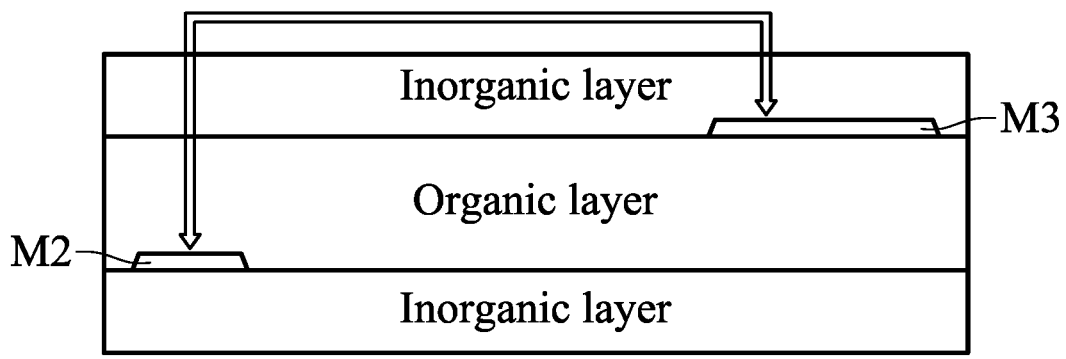
FIG. 7D is a schematic diagram showing the welding operation for welding two metal layers by TIG welding according to another embodiment of the disclosure.

FIG. 7D is a schematic diagram showing the welding operation for welding two metal layers by TIG welding according to another embodiment of the disclosure. In this embodiment, an electrode of the spare TFT may be disposed in the metal layer M2, the anode of the light-emitting element may be disposed in the metal layer M3, where the metal layers M2 and M3 may be not overlapped in the vertical direction (that is, the vertical projections of the metal layers M2 and M3 are separated from each other and do not overlap). In a default status (that is, when the repair has not been performed), the metal layer M2 and the metal layer M3 are electrically insulated. When performing the repair, the inorganic layer may be punctured from the top to respectively form two holes connectable to the metal layer M2 and the metal layer M3, and then the two holes are connected by tungsten plating, and the metal tungsten is deposited through the holes, so that the electrical connection between the metal layer M2 and the metal layer M3 can be generated for coupling one electrode of the spare TFT to the anode of the corresponding light-emitting element.

It should be noted that in the embodiment of the disclosure, the configuration of spare pixel circuit and the method for repairing the pixel circuit as illustrated above are not limited to be applied in a single display device, and are also applicable for a tiling panel.

Figures 8, 8A:
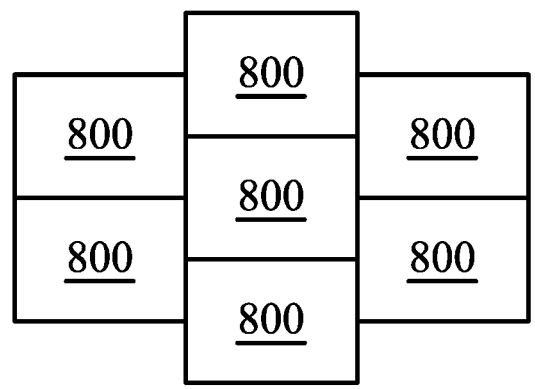
FIG. 8 is a schematic diagram of a tiling electronic device according to an embodiment of the disclosure.
FIG. 8A is an interlaced and adjacent arrangement of a schematic diagram of a tiling electronic device according to an embodiment of the disclosure.

FIG. 8 is a schematic diagram of a tiling electronic device according to an embodiment of the disclosure. The tiling electronic device may comprise a plurality of display devices 800 having spare pixel circuits configured therein and is configured to display an image signal. Any side of one of the display devices 800 is disposed adjacent to any side of another of the display devices 800, so as to form a large display panel having an effective active area that is larger than the active area of any one of the display devices 800, and each of the display devices 800 is configured to display a portion of the image signal. In an embodiment, the arrangement of the display devices 800 with any side of one display device being disposed adjacent to any side of another may be the matrix arrangement (as shown in FIG. 8), the interlaced and adjacent arrangement (as shown in FIG. 8A), or any combination thereof (using the matrix arrangement in the non-peripheral area and using the interlaced arrangement in the peripheral area, for example). Note that the arrangements discussed above are merely examples and the disclosure is not limited thereto. In another embodiment, the appearance of the electronic device may be designed to have a polygon shape, a circular shape, an oval shape, or a free shape, but the disclosure is not limited thereto.

In addition, the tiling electronic device (or the plurality of display devices comprised therein) may adopt the configuration of spare pixel circuit and the method for repairing the pixel circuit as illustrated above in the first embodiment of the disclosure, and may also adopt the configuration of spare pixel circuit and the method for repairing the pixel circuit as will be discussed in the second embodiment of the disclosure.

According to the second embodiment of the disclosure, the spare pixel circuit may have nearly the same configuration as the original pixel circuit (for example, the pixel circuit as shown in FIG. 2), and the difference is in that the spare pixel circuit does not comprise the light-emitting element (that is, the spare pixel circuit may comprise a complete driving circuit). When an abnormality occurs in the pixel circuit of any sub-pixel, a corresponding driving circuit can be selected based on the type of damaged or abnormal sub-pixel (for example, different type of sub-pixel may need different number of TFTs), so as to replace the driving circuit in the original pixel circuit.

According to the second embodiment of the disclosure, the spare pixel circuit may also comprise a single TFT (that is, configuring one or more spare TFTs in the display device). When an abnormality occurs in the TFT of any sub-pixel, the spare TFT may be utilized to replace the damaged or abnormal TFT in the original pixel circuit.

Figure 9:
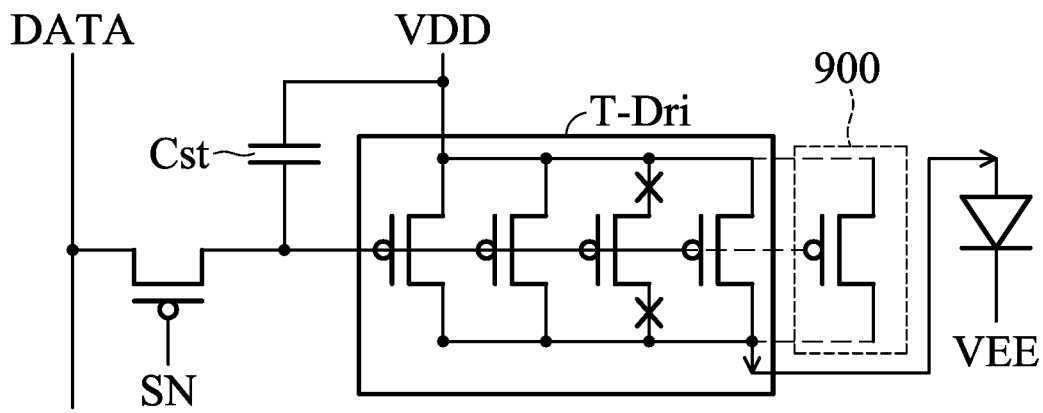
FIG. 9 is a schematic diagram of repairing the pixel circuit in the sub-pixel by using the spare pixel circuit according to the second embodiment of the disclosure.

FIG. 9 is a schematic diagram of repairing the pixel circuit in the sub-pixel by using the spare pixel circuit according to the second embodiment of the disclosure. As shown in FIG. 9, the spare pixel circuit 900 may comprise a single spare TFT with a terminal that is electrically floating, and the display device may comprise at least one spare pixel circuit 900. In this embodiment, when an abnormality occurs in the TFT of the sub-pixel, the electrical connections between the damaged or abnormal TFT and the driving circuit of the pixel circuit are disconnected (as the cross signs shown in figure) first. Next, the spare TFT is coupled to (as the slashes shown in the figure) the driving circuit of the pixel circuit, so as to replace the damaged or abnormal TFT.

Figure 10:
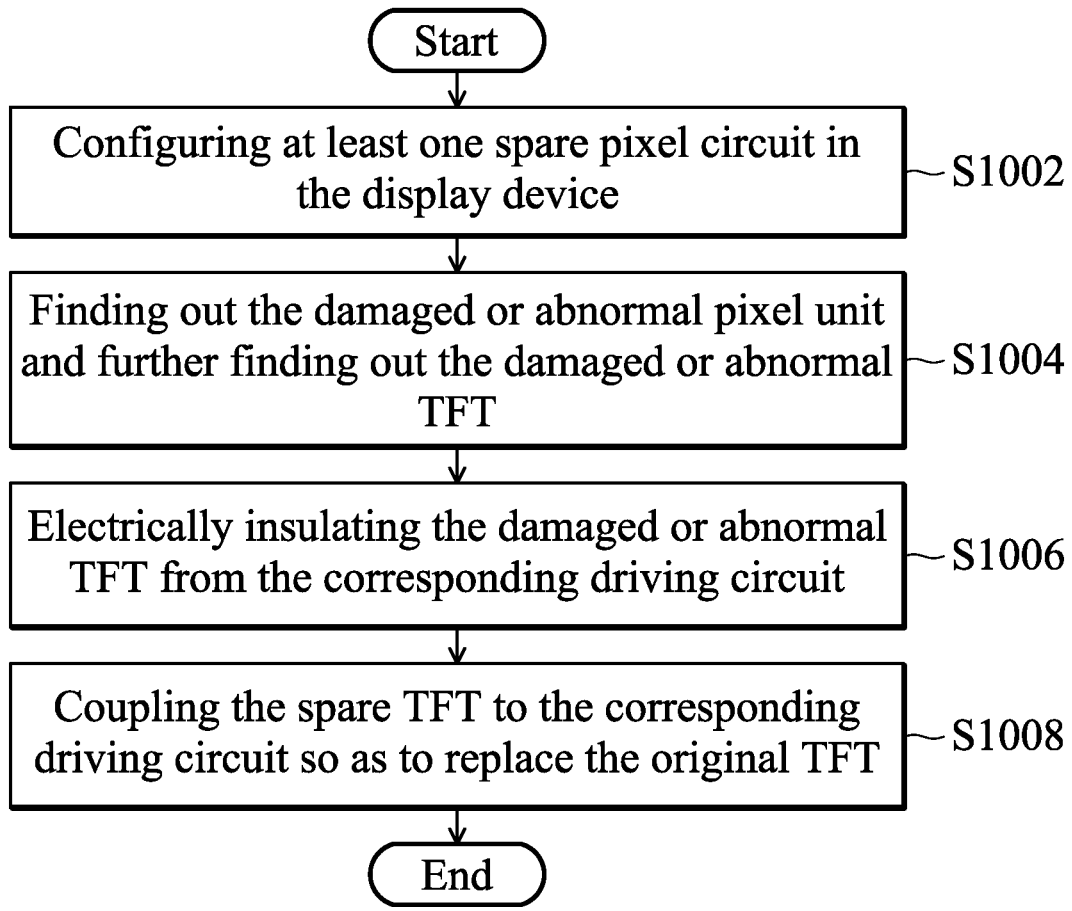
FIG. 10 is an exemplary flow chart of a method for repairing a display device according to the second embodiment of the disclosure.

FIG. 10 is an exemplary flow chart of a method for repairing a display device according to the second embodiment of the disclosure. First of all, at least one spare pixel circuit is configured in the display device (Step S1002). The spare pixel circuit comprises at least one spare TFT with a terminal being electrically floating. Next, the manufacturer of the display device may find the damaged or abnormal pixel unit and then find the damaged or abnormal TFT by testing whether each driving circuit functions normally and provides sufficient driving current required by the corresponding light-emitting element via the specific test circuit before installing the corresponding light-emitting element (Step S1004). If the light-emitting elements have already been installed, the manufacturer of the display device may also find the damaged or abnormal pixel unit and then find the damaged or abnormal TFT by using an optical instrument (for example, an optical microscope) when any bright spot or dark spot has been detected (Step S1004). Next, when any damaged or abnormal TFT has been found, as shown in FIG. 10, the damaged or abnormal TFT is electrically insulated from the corresponding driving circuit (Step S1006). That is, the electrical connection therebetween is disconnected. Finally, the spare TFT is coupled to the corresponding driving circuit so as to replace the original TFT (Step S1008).

As discussed above, by applying the configuration of spare pixel circuit and the method for repairing the pixel circuit as illustrated above in the embodiments of the disclosure, when an abnormality occurs in an original pixel circuit, the element of the spare pixel circuit can be utilized to replace the corresponding portion of the original pixel circuit, so as to repair the display device. In this manner, the lifespan of the display device can be extended or the problem of poor user experience due to the pixel defect or the line defect caused by the damaged pixel circuit can be avoided. Especially, when manufacturing a large display device, if a portion of the original pixel circuits has been detected as being abnormal or damaged via some test during the production process or when the production is completed, directly discarding the entire display device will result in serious production cost loss. Therefore, by applying the configuration of spare pixel circuit and the method for repairing the pixel circuit as illustrated above, the production cost of the display device can also be effectively reduced.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the disclosure has been described by way of example and in terms of embodiments, it should be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:
1. A display device, comprising:
   a pixel array, comprising a plurality of pixels;
   a plurality of data lines, coupled to the pixel array; and
   a plurality of gate lines, coupled to the pixel array,
   wherein at least one of the pixels comprises:
   a first sub-pixel, comprising a first pixel circuit, wherein the first pixel circuit of the first sub-pixel comprises:
   a first light-emitting element; and
   a first driving circuit, coupled to the first light-emitting element and configured to control the first light-emitting element, wherein the first driving circuit comprises a plurality of TFTs; and
   a second sub-pixel, comprising a second pixel circuit, wherein the second pixel circuit of the second sub-pixel comprises:
   a second light-emitting element; and
   a second driving circuit, coupled to the second light-emitting element and configured to control the second light-emitting element, wherein the second driving circuit comprises a plurality of TFTs, and
   wherein a number of the TFTs of the first driving circuit and a number of the TFTs of the second driving circuit are different.

2. The display device as claimed in claim 1, wherein the TFTs of the first driving circuit are coupled in parallel, and the TFTs of the second driving circuit are coupled in parallel.

3. The display device as claimed in claim 1, wherein the at least one of the pixels further comprises:
a third sub-pixel, comprising a third pixel circuit, wherein the third pixel circuit of the third sub-pixel comprises:
a third light-emitting element; and
a third driving circuit, coupled to the third light-emitting element and configured to control the third light-emitting element, wherein the third driving circuit comprises a plurality of TFTs.

4. The display device as claimed in claim 3, wherein the TFTs of the third driving circuit are coupled in parallel.

5. The display device as claimed in claim 3, wherein the number of the TFTs of the first driving circuit is greater than the number of the TFTs of the second driving circuit, and the number of the TFTs of the second driving circuit is greater than a number of the TFTs of the third driving circuit.

6. The display device as claimed in claim 3, further comprising:
a spare pixel circuit, comprising a plurality of spare TFTs, at least one electrode of one of the spare TFTs being electrically floating, wherein at least a predetermined number of the spare TFTs are coupled in parallel, and wherein the predetermined number equals the number of the TFTs of the third driving circuit.

7. The display device as claimed in claim 6, wherein when an abnormality occurs in either the first sub-pixel, the second sub-pixel or the third sub-pixel, the TFTs in the abnormal sub-pixel are electrically insulated from corresponding one of the first light-emitting element, the second light-emitting element and the third light-emitting element, and a specific number of the spare TFTs are coupled to the corresponding one of the first light-emitting element, the second light-emitting element and the third light-emitting element, so as to replace the TFTs in the abnormal sub-pixel.

8. A tiling electronic device, comprising a plurality of display devices configured to display an image signal, wherein at least one of the display devices comprises:
a pixel array, comprising a plurality of pixels;
a plurality of data lines, coupled to the pixel array; and
a plurality of gate lines, coupled to the pixel array,
wherein at least one of the pixels comprises:
a first sub-pixel, comprising a first pixel circuit, wherein the first pixel circuit of the first sub-pixel comprises:
a first light-emitting element; and
a first driving circuit, coupled to the first light-emitting element and configured to control the first light-emitting element, wherein the first driving circuit comprises a plurality of TFTs; and
a second sub-pixel, comprising a second pixel circuit, wherein the second pixel circuit of the second sub-pixel comprises:
a second light-emitting element; and
a second driving circuit, coupled to the second light-emitting element and configured to control the second light-emitting element, wherein the second driving circuit comprises a plurality of TFTs, and
wherein a number of the TFTs of the first driving circuit and a number of the TFTs of the second driving circuit are different, and
wherein any side of one of the display devices is disposed adjacent to any side of another of the display devices, and each of the display devices is configured to display a portion of the image signal.

9. The tiling electronic device as claimed in claim 8, wherein the TFTs of the first driving circuit of at least one of the display devices are coupled in parallel, and the TFTs of the second driving circuit of the at least one of the display devices are coupled in parallel.

10. The tiling electronic device as claimed in claim 9, wherein the at least one of the pixels further comprises:
a third sub-pixel, comprising a third pixel circuit, wherein the third pixel circuit of the third sub-pixel comprises:
a third light-emitting element; and
a third driving circuit, coupled to the third light-emitting element and configured to control the third light-emitting element, wherein the third driving circuit comprises a plurality of TFTs.

11. The tiling electronic device as claimed in claim 10, wherein the TFTs of the third driving circuit of the at least one of the display devices are coupled in parallel.

12. The tiling electronic device as claimed in claim 10, wherein the number of the TFTs of the first driving circuit is greater than the number of the TFTs of the second driving circuit, and the number of the TFTs of the second driving circuit is greater than a number of the TFTs of the third driving circuit.

13. The tiling electronic device as claimed in claim 10, further comprising:
a spare pixel circuit, comprising a plurality of spare TFTs, at least one electrode of one of the spare TFTs being electrically floating, wherein at least a predetermined number of the spare TFTs are coupled in parallel, and wherein the predetermined number equals the number of the TFTs configured in the third driving circuit.

14. The tiling electronic device as claimed in claim 13, wherein when an abnormality occurs in one of the first sub-pixel, the second sub-pixel and the third sub-pixel of one of the display devices, the TFTs in the abnormal sub-pixel are electrically insulated from corresponding one of the first light-emitting element, the second light-emitting element and the third light-emitting element, and a specific number of the spare TFTs are coupled to the corresponding one of the first light-emitting element, the second light-emitting element and the third light-emitting element, so as to replace the TFTs in the abnormal sub-pixel.

15. The display device as claimed in claim 1, further comprising:
a gate driving circuit, coupled to the pixel array via the plurality of gate lines; and
a data driving circuit, coupled to the pixel array via the plurality of data lines.

* * * * *